(12) United States Patent
Ke et al.

(10) Patent No.: US 8,507,932 B2
(45) Date of Patent: Aug. 13, 2013

(54) LED UNIT

(75) Inventors: Chih-Hsun Ke, Hsinchu (TW);
Hsing-Fen Lo, Hsinchu (TW);
Shiun-Wei Chan, Hsinchu (TW)

(73) Assignee: Advanced Optoelectronic Technology, Inc., Hsinchu Hsien (TW)

(*) Notice: Subject to any disclaimer, the term of this patent is extended or adjusted under 35 U.S.C. 154(b) by 77 days.

(21) Appl. No.: 13/178,517

(22) Filed: Jul. 8, 2011

(65) Prior Publication Data

US 2012/0049221 A1  Mar. 1, 2012

(30) Foreign Application Priority Data

Aug. 25, 2010  (CN) .......................... 2010 1 0259409

(51) Int. Cl.
*H01L 33/00* (2010.01)
(52) U.S. Cl.
USPC ............... 257/98; 257/E33.067; 257/E33.72; 257/E33.061; 313/502

(58) Field of Classification Search
USPC ............ 313/502; 257/79, 98–100, E33.067, 257/E33.72, E33.061
See application file for complete search history.

(56) References Cited

U.S. PATENT DOCUMENTS 7,759,671 B2 * 7/2010 Hsu et al. ...................... 257/13

* cited by examiner

*Primary Examiner* — David Vu
(74) *Attorney, Agent, or Firm* — Altis Law Group, Inc.

(57) ABSTRACT

An LED unit includes an LED and an optical element. The LED includes a substrate, an LED chip fixed on the substrate and an encapsulation encapsulating the LED chip. The LED further includes a first magnet fixed on the substrate. The optical element includes an optical adjustment layer and a second magnet. The second magnet attracts the first magnet to fix the optical element on the LED. The LED unit can be adjusted to have different optical characteristics by replacing the optical element thereof with another optical element.

11 Claims, 9 Drawing Sheets

LED UNIT

BACKGROUND

1. Technical Field

The disclosure relates to light emitting diodes, and particularly to an LED unit.

2. Description of the Related Art

Light emitting diodes (LEDs) have many advantages, such as high luminosity, low operational voltage, low power consumption, compatibility with integrated circuits, easy driving, long term reliability, and environmental friendliness. These advantages have promoted a wide use of the LEDs as a light source. Now, the light emitting diodes are commonly applied in environmental lighting.

Light from a common LED transfers to the specific wavelength by a fluorescent layer. However, an encapsulation of the LED is fixed on the substrate. The optical characteristics of the common LED cannot be adjusted, according to the specific needs.

Therefore, it is desirable to provide an LED unit which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED units. Moreover, in the drawings, like reference numerals designate corresponding parts throughout the views.

DETAILED DESCRIPTION

Embodiments of an LED unit as disclosed are described in detail here with reference to the drawings.

Figure 1:
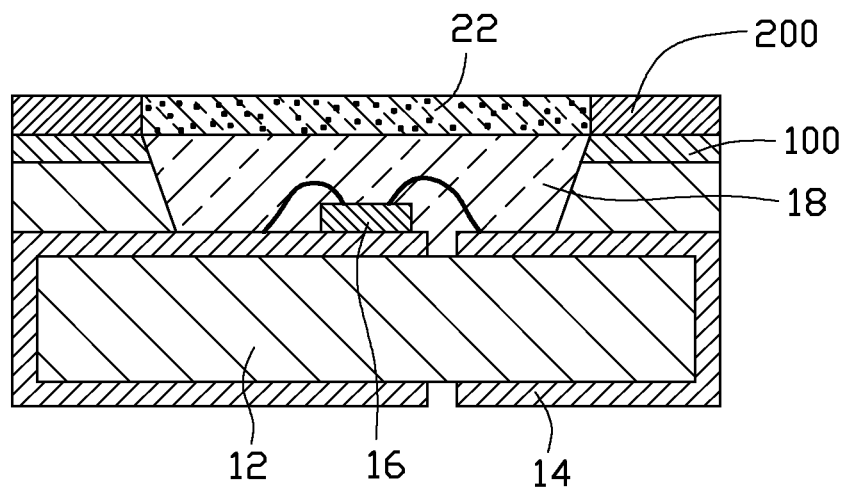
FIG. 1 is a cross-sectional view of an LED unit in accordance with a first embodiment.
Figure 2:
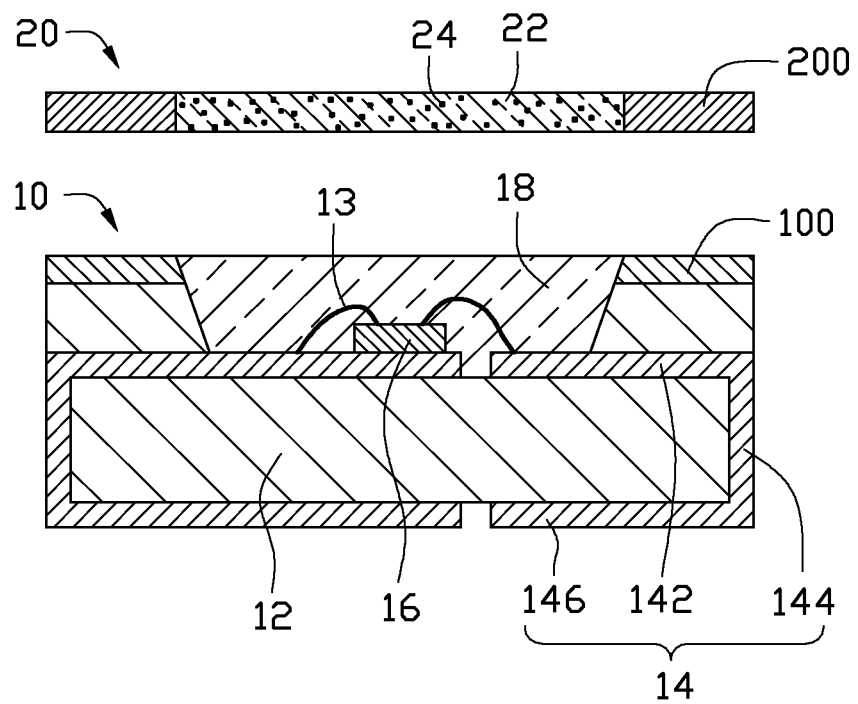
FIG. 2 is an exploded view of the LED unit of FIG. 1.
Figure 3:
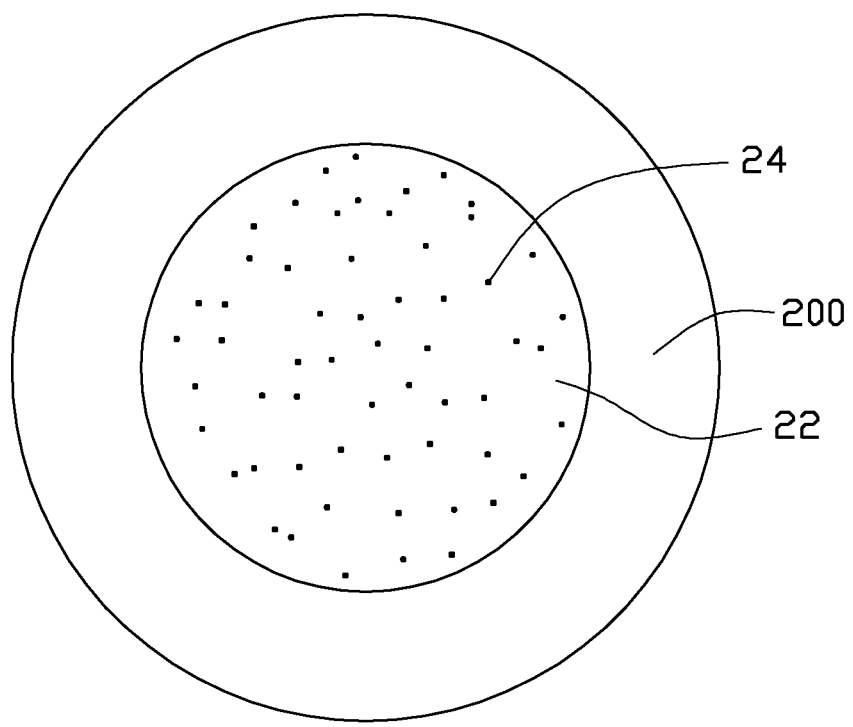
FIG. 3 is a top view of the LED unit of FIG. 1.

Referring to FIGS. 1 to 3, an LED unit 1 includes an LED 10 and an optical element 20 on the LED 10. The LED 10 includes a substrate 12, two lead frames 14 on the substrate 12, an LED chip 16 electrically connecting to the two lead frames 14, an encapsulation 18 covering the LED chip 16, and a first magnet 100 fixed on a top surface of the substrate 12. The substrate 12 can be epoxy resin, silicone, or other insulating materials. The substrate 12 is ceramic in a first embodiment. A cavity defined on the top surface of the substrate 12 receives the LED chip 16. The two lead frames 14 are respectively arranged at two sides of the substrate 12 and mutually electrically insulated. Each of the lead frames 14 includes a wire portion 142, a contact portion 146 parallel to the wire portion 142, and a connection 144 perpendicularly connected to the wire portion 142 and the contact portion 146. The wire portion 142 passing through the substrate 12 and exposed in the cavity is used for electrically connecting to the LED chip 16. The contact portion 146 arranged on a bottom of the substrate 12 is used for connecting to an external circuit (not shown). The connection 144 attached on the outside surface of the substrate 12 is used for conducting the current from the contact potion 146 to the wire portion 142.

The LED chip 16 is arranged on a top surface of the wire portion 142 of one of the lead frames 14. According to a color of light from the LED chip 16, the LED chip 16 can be made of different materials, such as InGaAlP, GaN, or GaP. The LED chip 16 is made of the semiconductor material emitting blue light in this embodiment.

Two electrodes (not shown) of the LED chips 16 electrically connect to the top surfaces of the wire portions 142 of the two lead frames 14 by two gold wires. The first magnet 100 which is ring-shaped and arranged on a top surface of the substrate 12 by glue includes an upwards first magnetic pole (for example north magnetic pole), and a downwards second magnetic pole (for example south magnetic pole). The encapsulation 18 is filled into the cavity and has the same height as a top surface of the first magnet 100. The encapsulation 18 protects the LED chip 16. The encapsulation 18 can be epoxy resin, silicone, glass or, other transparent materials. Light from the LED chip 16 travels through the encapsulation 18 and emits outwards.

The optical element 20 includes an optical adjustment layer 22 and a second magnet 200. The second magnet 200 which is a ring includes an upwards first magnetic pole and a second downwards magnetic pole. The second magnetic pole of the second magnet 200 is in contact with the first magnetic pole of the first magnet 100.

Thus, when the second magnet 200 is arranged on the first magnet 100, the second magnet 200 and the first magnet 100 are mutually attracted by magnetic force. The optical element 20 is fixed on the LED 10.

Because the optical element 20 connects to the LED 10 by magnetic force, the optical element 20 and the LED 10 are easily separated without any tools. An external diameter of the second magnet 200 is the same as that of the first magnet 100. An internal diameter of the second magnet 200 is also the same as that of the first magnet 100. The second magnet 200 surrounds the optical adjustment layer 22. The optical adjustment layer 22 can be epoxy resin, silicone, or glass transparent materials. The optical adjustment layer 22 is a round-plate structure. A top surface of the optical adjustment layer 22 is parallel to a bottom surface of the optical adjustment layer 22. The bottom surface of the adjustment layer 22 directly contacts a top surface of the encapsulation 18. A plurality of fluorescent powders 24 are filled into the adjustment layer 22. The fluorescent powders 24 can be garnet nitride, sulfide, nitrogen oxides, or silicate. The fluorescent powders 24 are used for transferring an original light from the LED 10 to the different wavelength.

Figure 4:
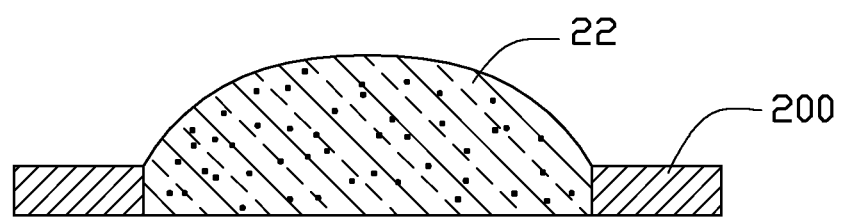
FIG. 4 is a cross-sectional view of an optical element of the LED unit in accordance with a second embodiment.
Figure 5:
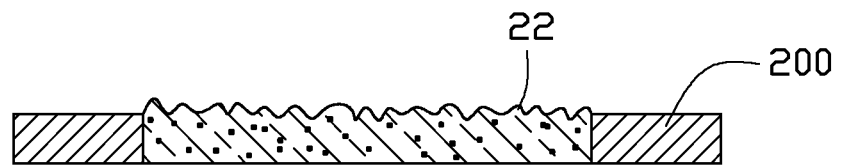
FIG. 5 is a cross-sectional view of an optical element of the LED unit in accordance with a third embodiment.

The optical adjustment layer 22 can be other optic structures, according to a specific optic field. Referring to FIG. 4, the top surface of the optical adjustment layer 22 can change other optical structure type and adjusts the optical field, according to specific needs. Referring to FIG. 4, the top surface of the optical adjustment layer 22 is formed as a convex. Thus, the optical adjustment layer 22 has a function of a light condenser. Referring to FIG. 5, the top surface of the optical adjustment layer 22 can be a rough surface. Thus, the optical adjustment layer 22 has a function of scattering light from the LED chip 16. Light from the LED chip 16 is uniform due to the rough surface.

Alternatively, just like the encapsulation 18, the optical adjustment layer 22 can also do not include the fluorescent powders 24 and is just for adjusting optical paths of light from the LED chip 16. Still alternatively, light scattering particles can be filled into the optical adjustment layer 22, causing light from the LEC chip 16 to be more uniform.

The bottom surface of the optical adjustment layer 22 can also form a protrusion (not shown). A hole (not shown) defined at the top surface of the encapsulation 18 of the LED 10 corresponds to the protrusion. Thus, the optical adjustment layer 22 is precisely arranged on the surface of the LED 10 by the protrusion inserted in the hole.

Figure 6:
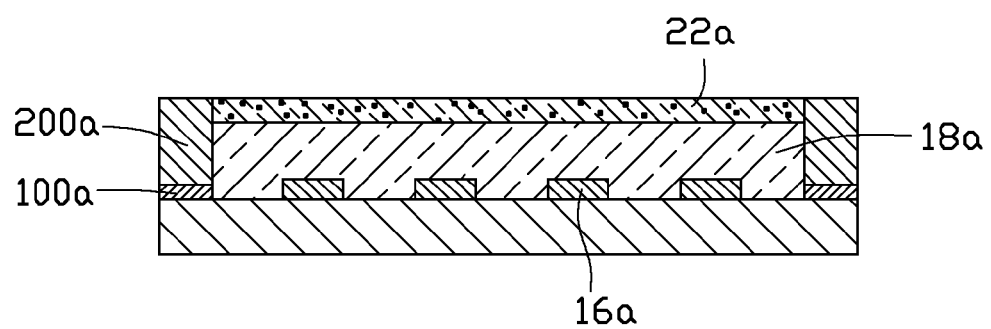
FIG. 6 is a cross-sectional view of an LED unit in accordance with a four embodiment.
Figure 7:
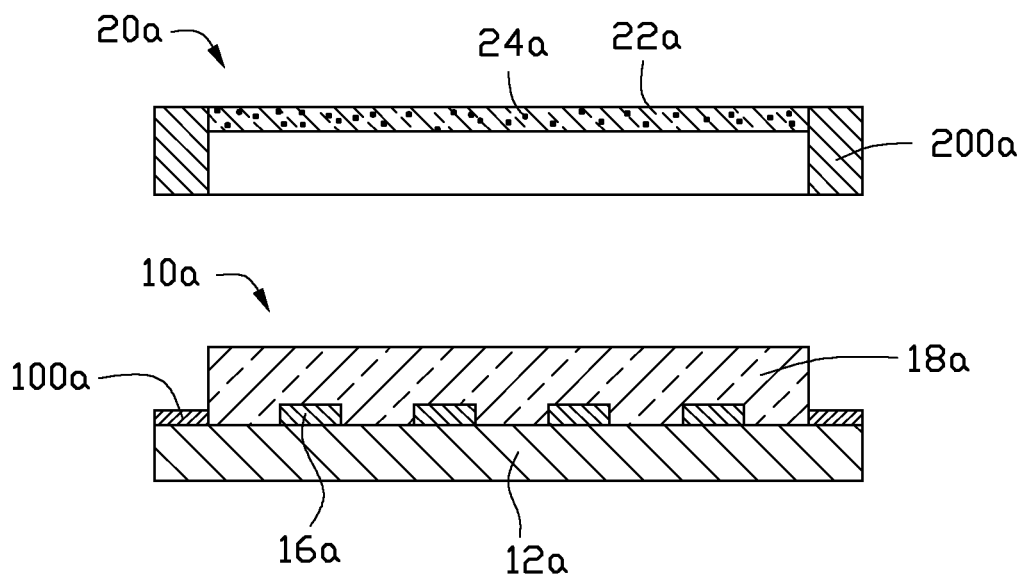
FIG. 7 is an exploded view of the LED unit of FIG. 6.
Figure 8:
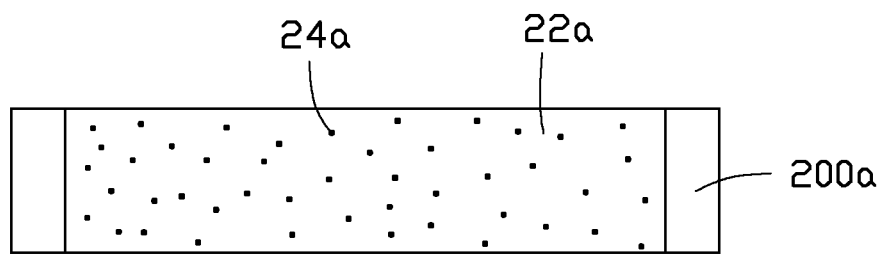
FIG. 8 is a top view of the LED unit of FIG. 6.

FIGS. 6-8 show that an LED 10*a* of multi chip package and an optical element 20*a* in fourth embodiment. A substrate 12*a* of the LED 10*a* is rectangle. A plurality of LED chips 16*a* is arranged on a top surface of the substrate 12*a*. According to the specific needs, the LED chips 16*a* can emit the same color or emit different colors. The LED chips 16*a* are arranged inside an encapsulation 18*a*. A ring-shaped first magnet 100*a* is fixed on the top surface of the substrate 12*a* surrounding the encapsulation 18*a*. The first magnet 100*a* has an upwards first magnetic pole and a downwards second magnetic pole. A thickness of the first magnet 100*a* is smaller than that of the encapsulation 18*a*. Thus, a portion of the encapsulation 18*a* is exposed outside.

The optical element 20*a* also includes a second magnet 200*a* and an optical adjustment layer 22*a* surrounded by the second magnet 200*a*. A plurality of fluorescent powders 24*a* are arranged inside the optical adjustment layer 22*a*, adjusting the color of light from the LED chips 16*a*. A thickness of the second magnet 200*a* exceeds that of the optical adjustment layer 22*a*. The second magnet 200*a* has an upwards first magnetic pole and a downwards second magnetic pole. The second magnetic pole of the second magnet 200*a* is in contact with the first magnetic pole of the first magnet 100*a*. Thus, the second magnet 200*a* arranged on the first magnet 100*a* and the first magnet 100*a* are mutually attracted by magnetic force. Because the optical element 20*a* connects to the LED 10*a* by magnetic force, the optical element 20*a* and the LED 10*a* are easily separated manually.

Figure 9:
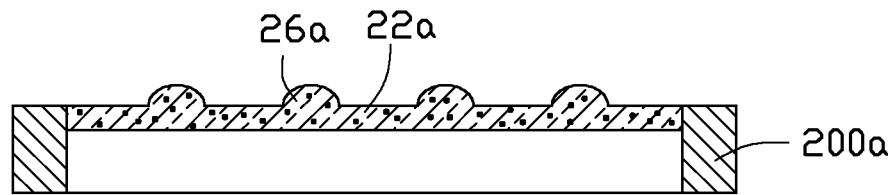
FIG. 9 is a cross-sectional view of an optical element of the LED unit of FIG. 6 in accordance with a fifth embodiment.

Referring to FIG. 9, a plurality of protruding lenses 26*a* is formed on the optical adjustment layer 22*a*, adjusting light respectively from each of the LED chips 16*a*.

Because the optical elements 20, 20*a* connect to the LEDs 10, 10*a* by magnetic force, the optical elements 20, 20*a* and the LEDs 10, 10*a* are easily separated manually. Thus, according to specific needs, the optical elements 20, 20*a* on the LEDs 10, 10*a* can easily be replaced.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED unit, comprising: an LED, and an optical element; the LED further including a substrate, an LED chip arranged on the substrate, and an encapsulation encapsulating the LED chip; wherein the LED further includes a first magnet arranged on the substrate, the optical element further includes an optical adjustment layer and a second magnet arranged on the optical adjustment layer;
   wherein the optical element is arranged on the LED to adjust characteristics of light emitted from the LED chip and the first magnet is connected to the second magnet by a mutual attraction force therebetween; and
   wherein the optical element is detachable from the LED by separating the first magnet from the second magnet.

2. The LED unit of claim 1, wherein the first magnet is around the encapsulation.

3. The LED unit of claim 2, wherein the second magnet is around the optical adjustment layer.

4. The LED unit of claim 1, wherein a bottom surface of the optical adjustment layer directly contacts the top surface of the encapsulation.

5. The LED unit of claim 1, wherein the optical adjustment layer includes a plurality of fluorescent powders.

6. The LED unit of claim 1, the optical adjustment layer is transparent material.

7. The LED unit of claim 1, wherein the first magnet has an upward first magnetic pole and a downward second magnetic pole, and the second magnet has an upward first magnetic pole and a downward second magnetic pole, the second magnetic pole of the second magnet being in contact with the first magnetic pole of the first magnet.

8. An LED unit comprising:
   an LED capable of emitting light;
   an optical element located over the LED for adjusting characteristics of the light emitted by the LED; and
   means for connecting the optical element to the LED by a magnetic attraction force;
   wherein the optical element is detachable from the LED by overcoming the magnetic attraction force of the means.

9. The LED unit of claim 8, wherein the optical element adjusts color of the light emitted from the LED.

10. The LED unit of claim 8, wherein the LED includes a substrate and an LED chip mounted on the substrate, the optical element including an optical adjustment layer, the connecting means comprising a first magnet mounted on the substrate and a second magnet fixed to the optical adjustment layer.

11. The LED unit of claim 10, wherein the first magnet has an upward first magnetic pole and a downward second magnetic pole, and the second magnet has an upward first magnetic pole and a downward second magnetic pole, the second magnetic pole of the second magnet being in contact with the first magnetic pole of the first magnet.

* * * * *